(12) United States Patent
Khaja et al.

(10) Patent No.: US 12,211,728 B2
(45) Date of Patent: Jan. 28, 2025

(54) ELECTROSTATIC CHUCK DESIGN WITH IMPROVED CHUCKING AND ARCING PERFORMANCE

(71) Applicant: Applied Materials, Inc., Santa Clara, CA (US)

(72) Inventors: Abdul Aziz Khaja, San Jose, CA (US); Venkata Sharat Chandra Parimi, Santa Clara, CA (US); Sarah Michelle Bobek, Sunnyvale, CA (US); Prashant Kumar Kulshreshtha, San Jose, CA (US); Vinay K. Prabhakar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 18 days.

(21) Appl. No.: 18/201,086

(22) Filed: May 23, 2023

(65) Prior Publication Data

US 2023/0298922 A1 Sep. 21, 2023

Related U.S. Application Data

(63) Continuation of application No. 16/677,491, filed on Nov. 7, 2019, now Pat. No. 11,682,574.

(Continued)

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32642* (2013.01); *H01J 37/32724* (2013.01); *H01L 21/68735* (2013.01)

(58) Field of Classification Search
CPC ............ H01L 21/6831; H01L 21/6833; H01L 21/68721; H01L 21/68735
See application file for complete search history.

(56) References Cited

U.S. PATENT DOCUMENTS

| 5,897,752 | A | 4/1999 | Hong et al. |
| 6,189,482 | B1 | 2/2001 | Zhao et al. |

(Continued)

FOREIGN PATENT DOCUMENTS

| CN | 1867694 A | 11/2006 |
| CN | 203707097 U | 7/2014 |

(Continued)

OTHER PUBLICATIONS

Chinese Office Action for Application No. 202010041965.0 dated Jun. 29, 2023.

(Continued)

*Primary Examiner* — Tyrone V Hall, Jr.
(74) *Attorney, Agent, or Firm* — Patterson + Sheridan, LLP (57) ABSTRACT

Aspects of the present disclosure relate to one or more implementations of a substrate support for a processing chamber. In one implementation, a substrate support includes a body having a center, and a support surface on the body configured to at least partially support a substrate. The substrate support includes a first angled wall that extends upward and radially outward from the support surface, and a first upper surface disposed above the support surface. The substrate support also includes a second angled wall that extends upward and radially outward from the first upper surface, the first upper surface extending between the first angled wall and the second angled wall. The substrate support also includes a second upper surface extending from (Continued)

the second angled wall. The second upper surface is disposed above the first upper surface.

20 Claims, 7 Drawing Sheets

Related U.S. Application Data

(60) Provisional application No. 62/774,644, filed on Dec. 3, 2018.

(56) References Cited

U.S. PATENT DOCUMENTS

| | | | |
|---|---|---|---|
| 6,721,162 | B2 | 4/2004 | Weldon et al. |
| 7,024,105 | B2 | 4/2006 | Fodor et al. |
| 8,274,017 | B2 | 9/2012 | Yap et al. |
| 2002/0059981 | A1 | 5/2002 | Hao et al. |
| 2002/0137334 | A1 | 9/2002 | Watanabe et al. |
| 2003/0071260 | A1 | 4/2003 | Ootsuka et al. |
| 2003/0180459 | A1 | 9/2003 | Redeker et al. |
| 2004/0112544 | A1 | 6/2004 | Yan et al. |
| 2007/0266945 | A1 | 11/2007 | Shuto et al. |
| 2008/0041312 | A1 | 2/2008 | Matsuyama et al. |
| 2008/0179288 | A1 | 7/2008 | Collins et al. |
| 2010/0071850 | A1 | 3/2010 | Himori et al. |
| 2010/0243606 | A1 | 9/2010 | Koshimizu et al. |
| 2011/0126984 | A1 | 6/2011 | Kang et al. |
| 2014/0251542 | A1 | 9/2014 | Parsey, Jr. et al. |
| 2015/0001180 | A1 | 1/2015 | Doan et al. |
| 2015/0340266 | A1 | 11/2015 | Ngo et al. |
| 2016/0068959 | A1 | 3/2016 | Lau et al. |
| 2017/0040198 | A1* | 2/2017 | Lin .................. H01L 21/67103 |
| 2017/0162417 | A1 | 6/2017 | Ye et al. |
| 2017/0250099 | A1 | 8/2017 | Balon |
| 2017/0353994 | A1 | 12/2017 | Kim et al. |
| 2017/0358431 | A1 | 12/2017 | Dorf et al. |
| 2018/0017473 | A1 | 1/2018 | Da Costa et al. |
| 2018/0033672 | A1 | 2/2018 | Woytowitz et al. |
| 2020/0224310 | A1 | 7/2020 | Bobek et al. |

FOREIGN PATENT DOCUMENTS

| | | |
|---|---|---|
| CN | 104716082 A | 6/2015 |
| CN | 104718608 A | 6/2015 |
| CN | 105793959 A | 7/2016 |
| CN | 106449503 A | 2/2017 |
| CN | 107004619 A | 8/2017 |
| CN | 107460451 A | 12/2017 |
| CN | 107591355 A | 1/2018 |
| CN | 210956592 U | 7/2020 |
| CN | 213242483 U | 5/2021 |
| EP | 1167571 A2 | 1/2002 |
| JP | 2002241946 A | 8/2002 |
| JP | 2003229408 A | 8/2003 |
| JP | 2004327761 A | 11/2004 |
| JP | 2005064460 A | 3/2005 |
| JP | 2006319093 A | 11/2006 |
| JP | 2007513255 A | 5/2007 |
| JP | 3972710 B2 | 9/2007 |
| JP | 2008198739 A | 8/2008 |
| JP | 2011529273 A | 12/2011 |
| JP | 2014013874 A | 1/2014 |
| JP | 2016501445 A | 1/2016 |
| JP | 2016503962 A | 2/2016 |
| JP | 2016530706 A | 9/2016 |
| JP | 2018107433 A | 7/2018 |
| KR | 20170003792 A | 1/2017 |
| TW | M410975 U | 9/2011 |
| TW | 201535466 A | 9/2015 |
| WO | 0231219 A1 | 4/2002 |

OTHER PUBLICATIONS

TW Office Action for Taiwan Patent Application No. 109101313 dated Aug. 17, 2023.
TW Office Action for Taiwan Patent Application No. 10844046 dated Sep. 20, 2023.
JP Office Action for Japanese Application No. 2021-529277 dated Jan. 16, 2024.
U.S. Appl. No. 16/677,491, filed Nov. 7, 2019.
U.S. Appl. No. 16/672,294, filed Nov. 1, 2019.
U.S. Appl. No. 16/703,140, filed Dec. 4, 2019.
International Search Report and Written Opinion dated Apr. 14, 2020 for Application No. PCT/US2019/066551.
International Search Report and Written Opinion dated Apr. 10, 2020 for Application No. PCT/US2019/060314.
Chinese Office Action dated Nov. 2, 2022 for Application No. 201911214538.1.
Taiwan Office Action dated Oct. 23, 2020 for Application No. 108144046.
U.S. Appl. No. 16/716,233, filed Dec. 16, 2019.
Chinese Office Action dated Apr. 2, 2020 for Application No. 201922123241.6.
Chinese Office Action dated Nov. 25, 2020 for Application No. 202021336306.1.
Chinese Office Action dated Jan. 28, 2021 for Application No. 202021336306.1.
Taiwan Office Action dated May 31, 2021 for Application No. 108144046.
Chinese Office Action dated Jun. 10, 2022 for Application No. 201911214538.1.
JP Office Action for Japanese Application No. 2021-540499 dated Jan. 9, 2024.
TW Office Action for Taiwan Patent Application No. 112131443 dated Jul. 19, 2024.
TW Office Action for Taiwan Patent Application No. 10839496 dated May 22, 2023.
KR Office Action dated Apr. 17, 2024, for Korean Patent Application No. 10-2021-7019349.
Office Action in related matter KR1020217019349 dated Nov. 18, 2024.

* cited by examiner

ELECTROSTATIC CHUCK DESIGN WITH IMPROVED CHUCKING AND ARCING PERFORMANCE

CROSS-REFERENCE TO RELATED APPLICATIONS

This application is a continuation of, and claims the benefit of, U.S. patent application Ser. No. 16/677,491, filed Nov. 7, 2019, which is herein incorporated by reference in its entirety. This application claims also the benefit of U.S. provisional patent application Ser. No. 62/774,644, filed Dec. 3, 2018, which is herein incorporated by reference in its entirety.

BACKGROUND

Field

Aspects of the present disclosure generally relate to plasma processing chambers. More particularly, aspects of the present disclosure relate to a substrate support disposed in a plasma processing chamber.

Description of the Related Art

Plasma processing systems are used to form devices on a substrate, such as a semiconductor substrate or a transparent substrate. The substrate is held on a substrate support during processing. The substrate may be held to the substrate support by vacuum, gravity, electrostatic forces, or by other suitable techniques. During processing, the precursor gas or gas mixture in the chamber is energized (e.g., excited) into a plasma by applying a power, such as a radio frequency (RF) power, to an electrode in the chamber from one or more power sources coupled to the electrode. The excited gas or gas mixture reacts to etch or form a layer of material on a surface of the substrate. The layer may be, for example, a passivation layer, a gate insulator, a buffer layer, and/or an etch stop layer.

During plasma processing, a plasma is formed between the substrate support, heater, pedestal, or electrostatic chuck (ESC) and the top of the processing chamber. At higher processing temperature (e.g.: 650C), the substrate bow is high and ESC is used to chuck the substrate for good uniformity. An RF return path of the plasma passes through the substrate support and back to the RF power source. Non-uniformity or skew of processing results (e.g., etch, deposition and the like) may be caused by asymmetry of the RF return path or geometry of pedestal heater and/or bending of the plasma sheath around the pedestal heater edge. In some systems, prevention of arcing along the RF return path particularly in the proximity of the substrate support is a major challenge.

Therefore, there is a need for an improved substrate support in the plasma processing chamber.

SUMMARY

Aspects of the present disclosure relate to one or more implementations of a substrate support for a processing chamber. The substrate support is configured to reduce arcing and improve plasma sheath uniformity at the substrate edge resulting in more uniform deposited material layers among other benefits.

In one implementation, a substrate support includes a body having a center, and a support surface on the body configured to at least partially support a substrate. The substrate support includes a first angled wall that extends upward and radially outward from the support surface, and a first upper surface disposed above the support surface. The substrate support also includes a second angled wall that extends upward and radially outward from the first upper surface, the first upper surface extending between the first angled wall and the second angled wall. The substrate support also includes a second upper surface extending from the second angled wall. The second upper surface is disposed above the first upper surface.

In one implementation, a substrate support includes a body having a center, a support surface on the body configured to at least partially support a substrate, and a first angled sidewall that extends upward and radially outward. The substrate support also includes a first upper surface disposed above the support surface and a second angled sidewall that extends downward and radially outward. The substrate support also includes a second upper surface disposed below the first upper surface.

In one implementation, a substrate support includes a body having a center and a support surface on the body configured to at least partially support a substrate. The substrate support also includes a protrusion that protrudes from the support surface. The protrusion includes a first angled wall that extends upward and radially outward from the support surface, a first top surface, and a rear wall. The first top surface extends from the first angled wall to the rear wall. The substrate support also includes an edge ring disposed outside of the protrusion and at a gap from the rear wall of the protrusion.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Disclosed herein is an improved electrostatic chuck (ESC) design. The ESC described herein facilitates arcing free deposition of conductive films with center to edge thickness uniformity. The ESC aspects described herein facilitate deposition of conductive films at high operating temperatures with reduced or eliminated arcing and uniformity better than other substrate supports. The arc-resistant ESC enables high voltage deposition processes that provide an advantage for next node applications by reducing or eliminating DC discharge phenomenon during deposition. Such discharge can lead to substrate damage and particle contamination issues. Additionally, overall film uniformity (thickness, k) is improved, including reduced edge thickness drop, which sometimes cannot be resolvable by process alterations or other hardware tuning adjustments. The ESC also reduces or eliminates the probability of substrate sliding with high density dimples. The ESC enables high RF power substrate processing for improved processing throughput. The improvements have an additional benefit of low cost ESC design.

Challenges faced during conductive film deposition include arcing (i.e., DC discharge) due to the conductive nature of the film, and poor uniformity of the deposited film, specifically at the edge of the substrate. As the film uniformity increases, the charge build-up on the heater increases. The discharge of this build-up may result in chamber arcing events. The edge uniformity issues can result from the non-uniform plasma density distribution and shadowing effects from the pocket used to keep the substrate in position.

ESC's can increase uniformity at the expense of high arcing frequency for thick conductive films or vice versa. The aspects of the ESC disclosed herein address these issues. Aspects of the ESC disclosed herein facilitate increased deposition uniformity while facilitating reduced or eliminated arcing, with respect to the occurrences and/or magnitude of arcing.

The ESC disclosed herein utilizes easily machineable design aspects to facilitate "correction" of the plasma density distribution over the substrate area to improve deposition uniformity. The ESC is configured to expand the plasma from the substrate edge in a direction from a center of the substrate and radially outwards and away from the substrate edge, facilitating deposition uniformity and reduced arcing. The expansion, or pushing, of the plasma radially outward from the substrate edge enables the use of a pocket design which facilitates reduced or eliminated arcing during thick film deposition. Thus, aspects of the ESC described herein are able to combine a high arcing margin with low profile on-substrate uniformity into a single pedestal heater for the first time.

Aspects of the present disclosure include benefits such as significant arcing margin which facilitates qualifying product to the next node development, increased deposition uniformity, decreased edge thickness loss, high RF power substrate processing, ease of manufacturing involving reduced costs, reduced substrate defects, and increased yield and throughput.

Figure 1:
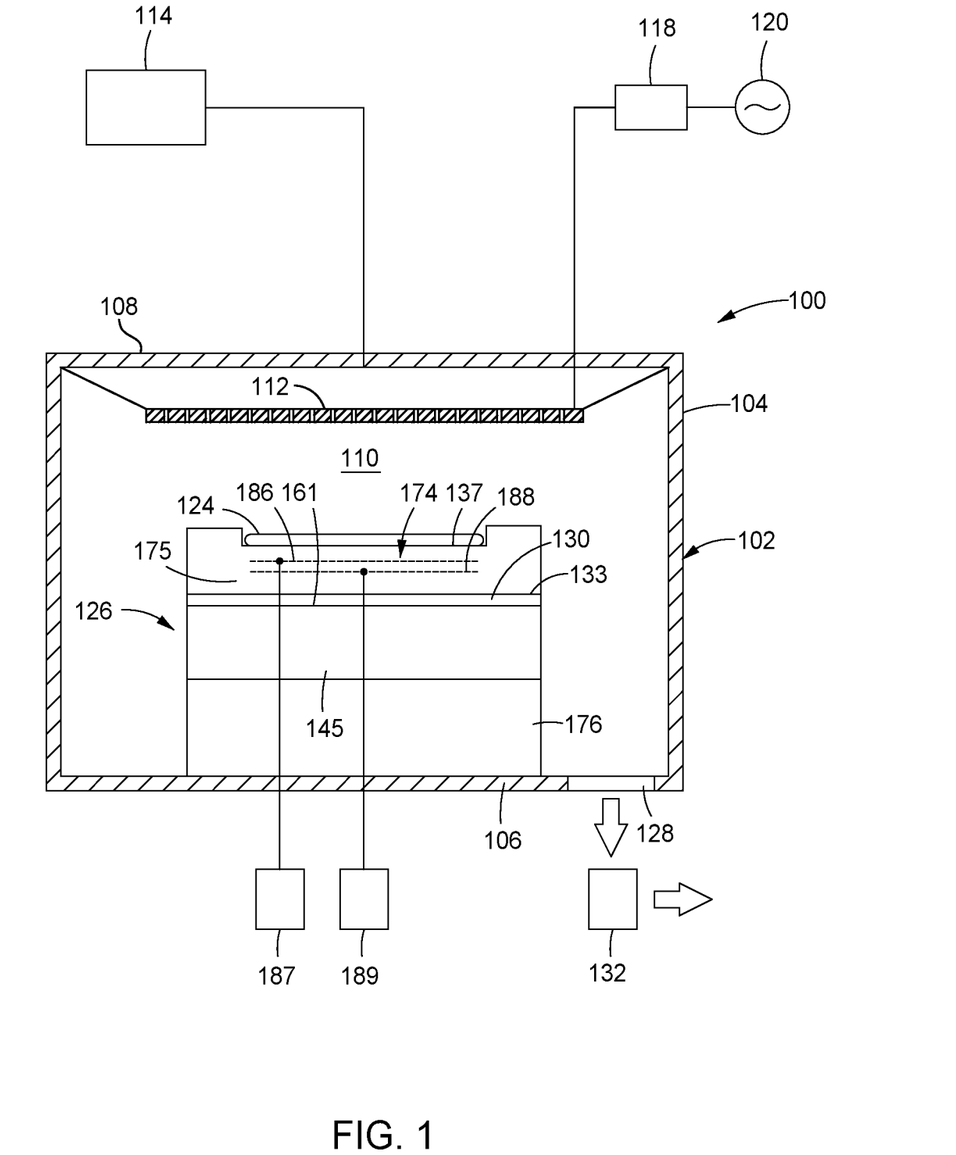
FIG. 1 is a cross-sectional schematic view of a plasma processing chamber, according to one implementation.

FIG. 1 is a cross-sectional schematic view of a plasma processing chamber 100, according to one implementation. The plasma processing chamber 100 is shown configured as a deposition chamber. A substrate support assembly 126 is disposed in the plasma processing chamber 100 and is configured to support a substrate during processing. The substrate support assembly 126 may be utilized in various processing chambers, for example plasma treatment chambers, annealing chambers, physical vapor deposition chambers, chemical vapor deposition chambers, etch chambers, and/or ion implantation chambers, among others. The substrate support assembly 126 may be used in other systems to control processing uniformity for a surface or workpiece, such as a substrate. Aspects of the present disclosure facilitate control of dielectric properties tan ($\delta$) (i.e., dielectric loss) or $\rho$ (i.e., the volume resistivity) at elevated temperature ranges for the substrate support assembly 126. Control of the dielectric properties facilitates azimuthal processing control, (i.e., processing uniformity) for a substrate 124 disposed on the substrate support assembly 126.

The plasma processing chamber 100 includes a chamber body 102 having one or more sidewalls 104, a bottom 106 and a lid 108 that enclose an interior processing region 110. An injection apparatus 112 is coupled to the sidewalls 104 and/or lid 108 of the chamber body 102. A gas panel 114 is coupled to the injection apparatus 112 to allow processing gases to be provided into the interior processing region 110. The injection apparatus 112 may be a showerhead, such as a diffuser and a backing plate. Processing gas, along with any processing by-products, are removed from the interior processing region 110 through an exhaust port 128 formed in the sidewalls 104 and/or the bottom 106 of the chamber body 102. The exhaust port 128 is coupled to a pumping system 132, which includes throttle valves and pumps utilized to control the vacuum levels within the interior processing region 110 and exhaust materials from the interior processing region 110.

The processing gas is energized to form a plasma within the interior processing region 110. The processing gas may be energized by capacitively or inductively coupling RF power provided to the processing gases. In the example illustrated in FIG. 1, the injection apparatus 112 is disposed below the lid 108 of the plasma processing chamber 100 and coupled through a matching circuit 118 to an RF power source 120.

The substrate support assembly 126 is disposed in the interior processing region 110 below the injection apparatus 112. The substrate support assembly 126 includes a substrate support 174 and a cooling base 130. The cooling base 130 is supported by a base plate 176. The base plate 176 is supported by one of the sidewalls 104 and/or the bottom 106 of the plasma processing chamber 100. The substrate support 174 may be a vacuum chuck, a heater, an electrostatic chuck (ESC) or other suitable support for holding a substrate thereon while processing the substrate in the plasma processing chamber 100. In one example, the substrate support 174 is an ESC. The substrate support assembly 126 may additionally include an embedded resistive heater assembly. The heater may be integral to the substrate support 174. Additionally, the substrate support assembly 126 may include a facility plate 145 and/or an insulator plate disposed between the cooling base 130 and the base plate 176 to facilitate electrical, cooling, and/or gas connections within the substrate support assembly 126.

The substrate support 174 includes one or more chucking electrodes (e.g., RF Mesh or other electrically conductive members) 186 disposed in a dielectric body 175. The dielectric body 175 has a workpiece support surface 137 to support the substrate 124 and a bottom surface 133 opposite the workpiece support surface 137. The dielectric body 175 of the substrate support 174 is fabricated from a ceramic material, such as alumina ($Al_2O_3$), aluminum nitride (AlN), or other suitable material. The dielectric body 175 may be fabricated from a polymer, such as polyimide, polyetheretherketone, polyaryletherketone, and the like.

The dielectric body 175 optionally includes one or more resistive heaters (heating elements) 188 embedded therein. The resistive heaters 188 are utilized to elevate the temperature of the substrate support assembly 126 to a temperature suitable for processing the substrate 124 disposed on the workpiece support surface 137 of the substrate support assembly 126. The resistive heaters 188 may be used to maintain the temperature of the substrate support assembly 126 between processing substrates. The resistive heaters 188 are coupled through the facility plate 145 to a heater power source 189. The heater power source 189 may provide 900 watts or more AC power to the resistive heaters 188. A controller is utilized control the operation of the heater power source 189, which is set to heat the substrate 124 and/or the substrate support assembly 126 to a predefined temperature. In one example, the resistive heaters 188 include a plurality of laterally separated heating zones. The controller enables at least one zone of the plurality of laterally separated heating zones to be preferentially heated relative to one or more resistive heaters 188 located in one or more of the other zones. For example, the resistive heaters 188 may be arranged concentrically in a plurality of separated heating zones. The one or more resistive heaters 188 maintain the substrate 124 at a temperature for processing, such as between about 180 degrees Celsius to about 700 degrees Celsius. In one example, the temperature for processing is greater than about 550 degrees Celsius, such as between about 350 degrees Celsius and about 700 degrees Celsius.

The chucking electrode 186 may be configured as a mono polar or bipolar electrode, or other suitable arrangement. The chucking electrode 186 is coupled through an RF filter to a chucking power source 187, which provides a DC power to electrostatically secure (e.g., chuck) the substrate 124 to the workpiece support surface 137 of the substrate support 174. The RF filter prevents RF power utilized to form a plasma within the plasma processing chamber 100 from damaging electrical equipment or presenting an electrical hazard outside the plasma processing chamber 100.

The workpiece support surface 137 of the substrate support 174 may include gas passages for providing backside heat transfer gas to the interstitial space defined between the substrate 124 and the workpiece support surface 137 of the substrate support 174. The substrate support 174 also includes lift pin holes for accommodating lift pins for elevating the substrate 124 above the workpiece support surface 137 of the substrate support 174 to facilitate robotic transfer into and out of the plasma processing chamber 100. An edge ring may optionally be disposed along a periphery of the workpiece support surface 137 of the substrate support 174. For example, the edge ring may be disposed about an outer edge of the substrate 124.

Figure 2A:
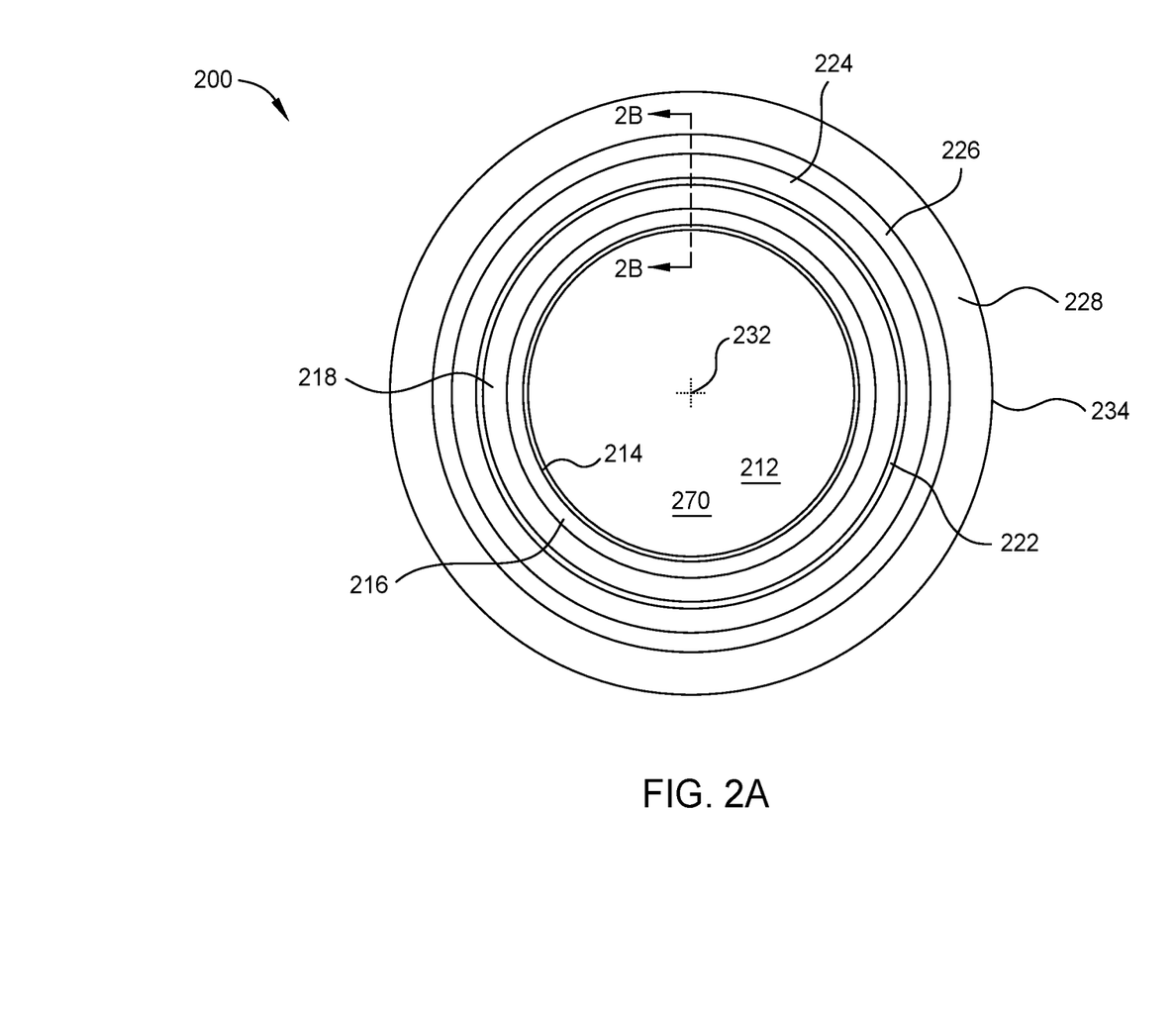
FIG. 2A is a top schematic view of a substrate support, according to one implementation.
Figure 2B:
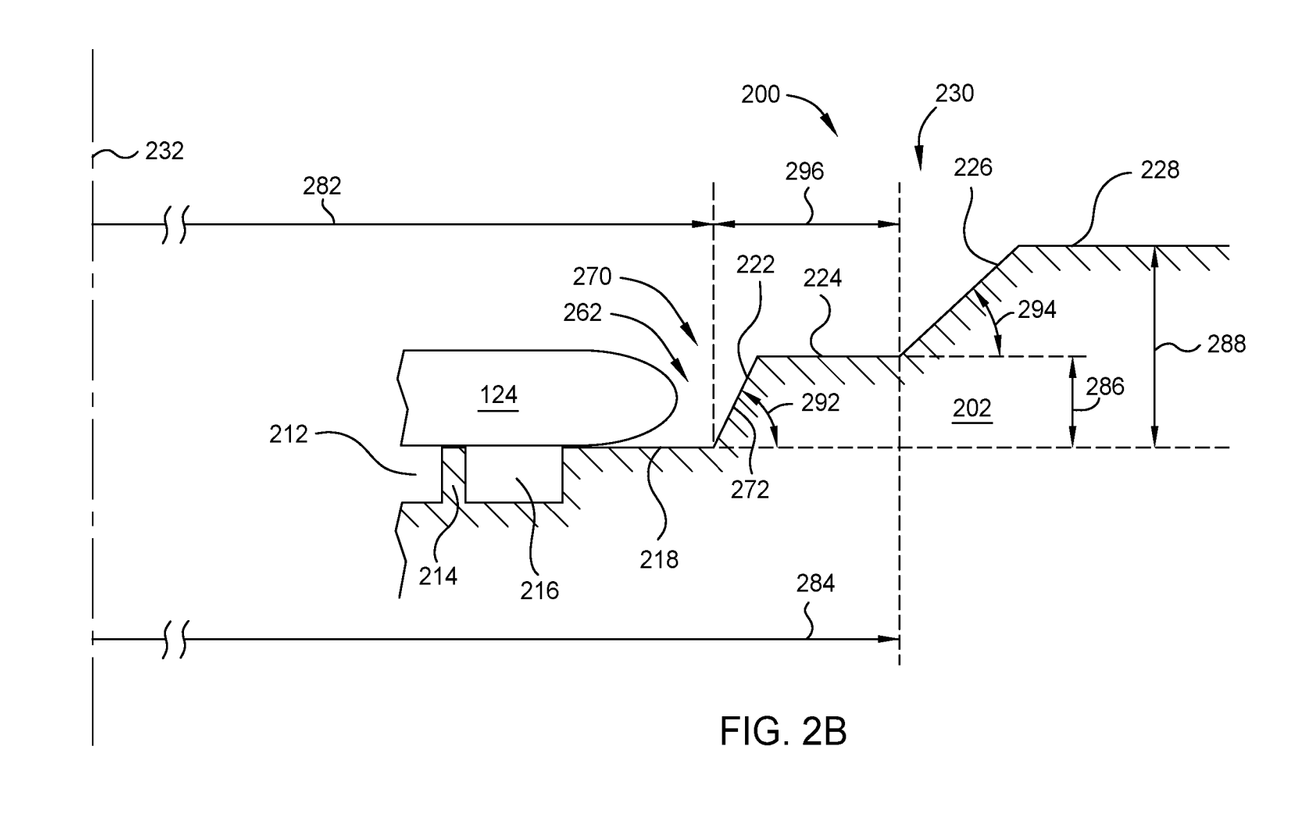
FIG. 2B is a cross sectional schematic view of the substrate support of FIG. 2A, according to one implementation.

FIG. 2A is a top schematic view of a substrate support 200, according to one implementation. The substrate support 200 is suitable for use as the substrate support 174 illustrated in the plasma processing chamber 100 of FIG. 1. FIG. 2B is a cross sectional schematic view of the substrate support 200 of FIG. 2A, according to one implementation. FIGS. 2A and 2B will be discussed together. The substrate support 200 includes an integrated edge ring such that the substrate support 200 and the integrated edge ring form a single mass of material (e.g., monobody) that does not utilize a separate edge ring.

The substrate support 200 has a body 202. The body 202 has a circular top profile with a center 232 and an outer periphery 234. The body 202 has a plurality of surfaces extending along a top face 230 of the body 202. The body 202 has a lower ledge 212 which extends from the center 232 of the substrate support 200. The lower ledge 212 extends to a first lip 214. The first lip 214 is configured to support the substrate 124 thereon. A troth 216 extends from the first lip 214 to a second lip 218 configured to support the substrate 124 thereon. The first lip 214 and the second lip 218 are substantially coplanar with the troth 216 below both the first lip 214 and the second lip 218. The first lip 214 and the second lip 218 are configured to support the substrate 105 thereon. The substrate 124 is supported in a pocket 270 of the substrate support 200. The substrate 124 is at least partially supported on one or more support surfaces of the first lip 214 and/or the second lip 218.

The second lip 218 extends from the troth 216 to a first angled wall 222. The first angled wall 222 begins at a first distance 282 from the center 232 and angles upward and outward at a first angle 292 away from the center 232 (e.g., radially outward) and from an upper plane of the second lip 218. The upper plane corresponds to the support surface of the second lip 218. The first angled wall 222 defines a sidewall 272 for the pocket 270. The first distance 282 is between about 5.5 inches to about 6.15 inches from the center 232. In one example, the first distance 282 is between about 5.5 inches to about 6.0 inches from the center 232. In one example, the first distance 282 is between about 5.91 inches to about 6.15 inches from the center 232. The first distance 282 defines a gap 262 between the substrate 105 and the sidewall 272 of the pocket 270. In the example illustrated, the sidewall 272 of the pocket 270 is defined by the first angled wall 222. The first angle 292 is between about 30 degrees and 90 degrees, as shown. The first angled wall 222 extends to a first upper surface 224. The first upper surface 224 extends from the first angled wall 222 to a second angled wall 226. The second angled wall 226 begins at a second distance 284 from the center 232 and angles upward and outward at a second angle 294 away from the center 232 and from a plane of the first upper surface 224. The second distance 284 is between about 6.000 inches to about 7.000 inches from the center 232. The second angle 294 of the second angled wall 226 extends between about 5 degrees and 60 degrees as shown. The second angle 294 is smaller than the first angle 292. The second angled wall 226 extends to a second upper surface 228. The second upper surface 228 extends from the second angled wall 226 to the outer periphery 234. The first upper surface 224 and the second upper surface 228 are parallel to the support surface of the second lip 218.

A difference between the second distance 284 and the first distance 282 defines a first step width 296 of the first angled wall 222 and the first upper surface 224. The first step width 296 is within a range of 0 inches to 1.5 inches. A first ratio is defined by the first distance 282 relative to a radius of the substrate 124. In one example, the first ratio is within a range of 1.0 to 1.1, such as 1.0 to 1.05. A second ratio is defined by the first step width 296 relative to the first distance 282. In one example, the second ratio is 0.3 or less, such as within a range of 0.1 to 0.3.

The first upper surface 224 is higher than the upper plane of the second lip 218. The first upper surface 224 is a third distance 286 above the second lip 218 to promote process uniformity by extending the plasma sheath upwards beyond the edge of the substrate 105 during plasma processing. The third distance 286 defines a height of the pocket 270. In one embodiment, which can be combined with other embodiments, the third distance 286 is between about 0.005 inches and about 0.050 inches.

The second upper surface 228 is higher than both the first upper surface 224 and the second lip 218. The second upper surface 228 is a fourth distance 288 above the second lip 218 to promote process uniformity by extending the plasma sheath upwards beyond the edge of the substrate 105 during plasma processing. In one embodiment, which can be combined with other embodiments, the fourth distance 288 is between about 0.050 inches and about 0.500 inches. In one example, the fourth distance 288 is between about 0.050 inches and about 0.100 inches.

The first distance 282 and the second distance 284 are taken along a horizontal plane. The third distance 286 and the fourth distance 288 are taken along a vertical plane that is substantially perpendicular to the horizontal plane of the first distance 282 and the second distance 284.

The first angled wall 222, first upper surface 224, second angled wall 226, and second upper surface 228 at least partially form a protrusion of the body 202 that protrudes upward from the second lip 218. The protrusion is integrally formed with the body 202.

Based on plasma simulations, the edge thickness variation is driven by plasma density variations from edge effects. Thus, to improve the edge uniformity, two stepped surfaces (e.g., the first upper surface 224 and the second upper surface 228) facilitate preventing sliding of the substrate 124. The two stepped surfaces also facilitate arcing performance, and promotes a smoother plasma sheath profile over the substrate 124, such as near the outer edge of the substrate 125. That is, the plasma sheath is flat extending beyond the outer edge of the substrate 124 for better processing uniformity at the outer edge of the substrate 124.

Figure 3A:
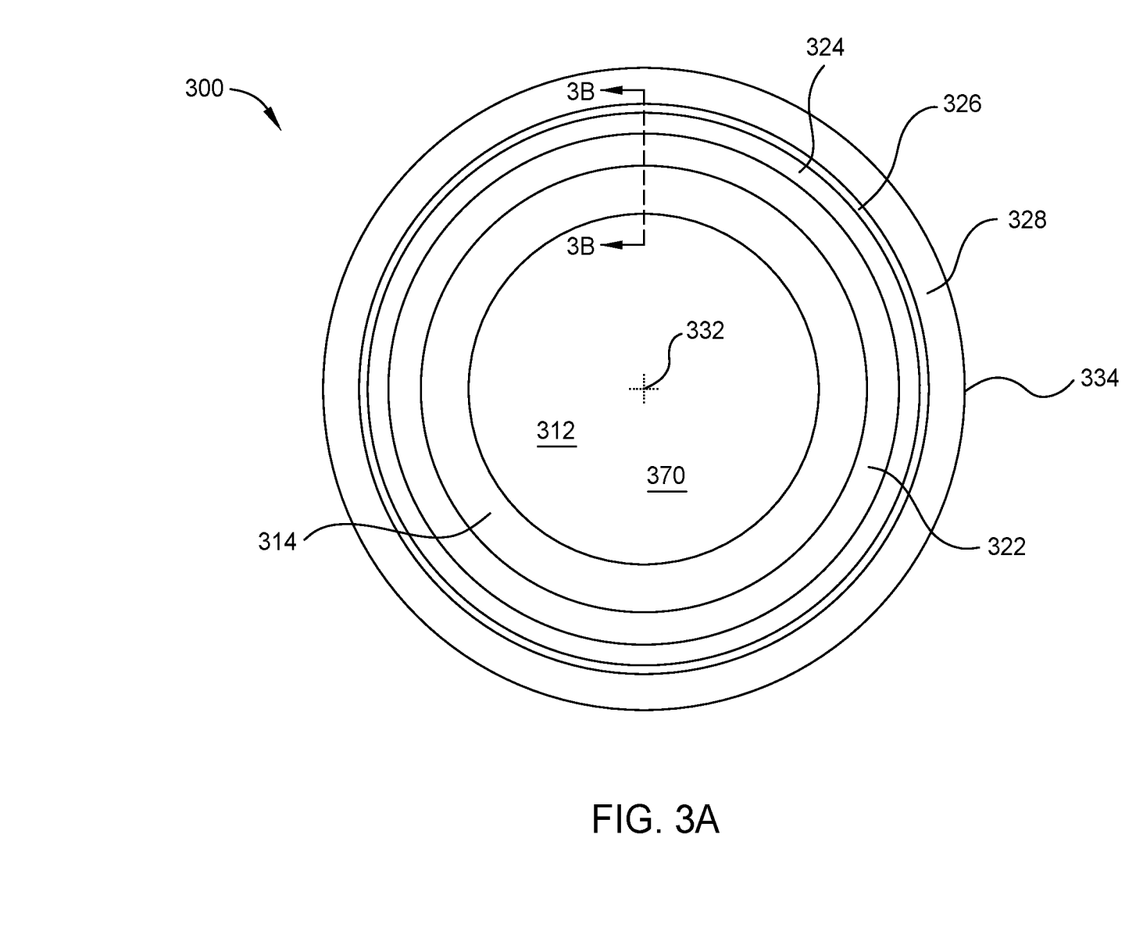
FIG. 3A is a top schematic view of a substrate support, according to one implementation.
Figure 3B:
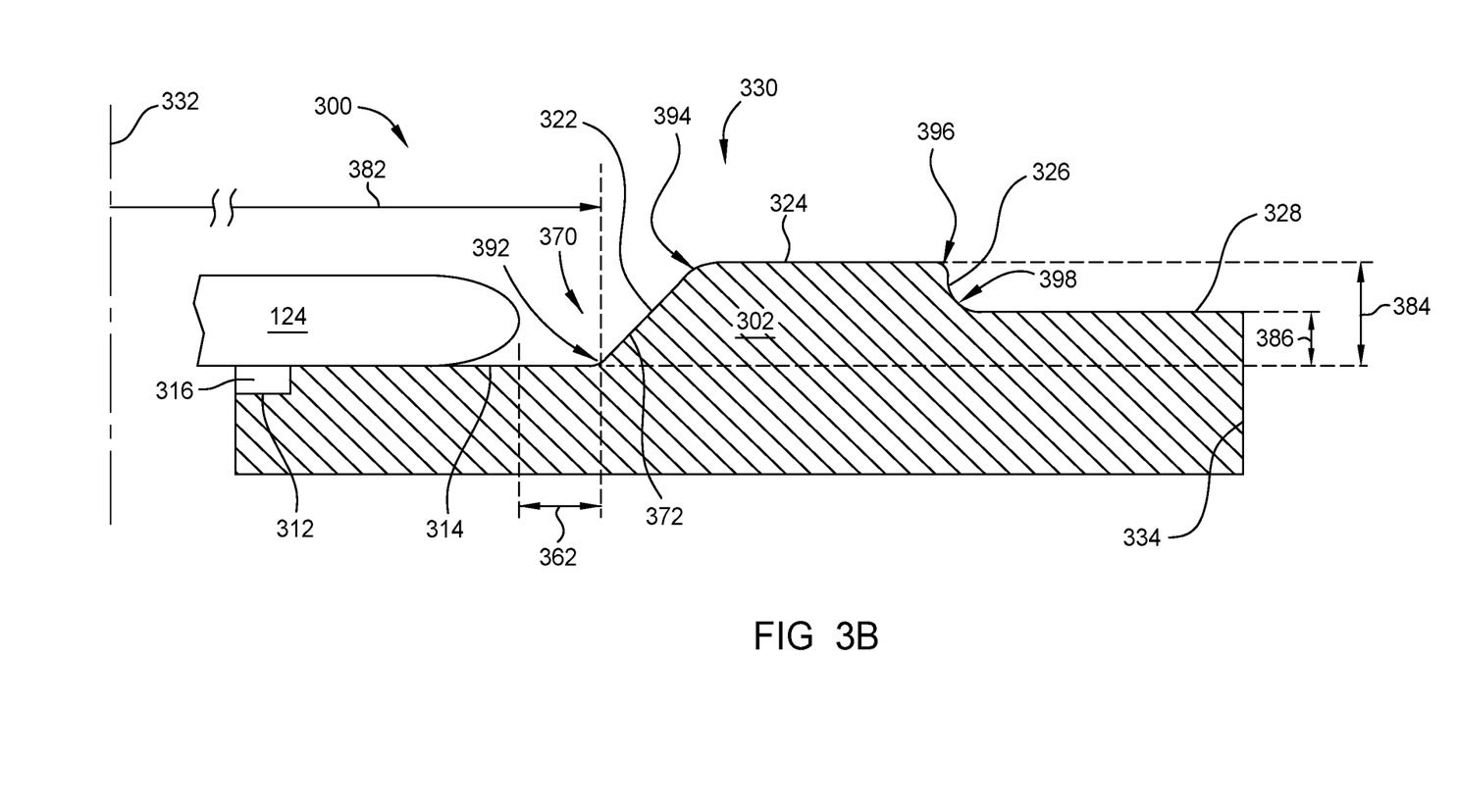
FIG. 3B is a cross sectional schematic view of the substrate support of FIG. 3A, according to one implementation.

FIG. 3A is a top schematic view of a substrate support 300, according to one implementation. The substrate support 300 is suitable for use as the substrate support 174 in the plasma processing chamber 100 of FIG. 1. FIG. 3B is a cross sectional schematic view of the substrate support 300 of FIG. 3A, according to one implementation. FIGS. 3A and 3B will be discussed together. The substrate support 300 includes an integrated edge ring such that the substrate support 300 and the integrated edge ring form a single mass of material that does not utilize a separate edge ring.

The substrate support 300 has a body 302. The body 302 has a circular top profile with a center 332 and an outer periphery 334. The body 302 has a plurality of surfaces extending along a top face 330 of the body 302. The body has a lower ledge 312 which extends from the center 332 of the substrate support. The lower ledge 312 extends to a support surface 314. The support surface 314 is configured to support the substrate 124 thereon in a pocket 370. In one example, the lower ledge 312 is below the support surface 314 and the substrate 124 supported on the support surface 314 does not contact the lower ledge 312 unless bowed or chucked. In such an example, a gap 316 is disposed between the substrate 124 and the lower ledge 312 unless the substrate 124 is bowed or checked. In one example, the lower ledge 312 is substantially planar and parallel with the support surface 314.

The support surface 314 extends from the lower ledge 312 to a first arcuate surface defined by a first radius 392. The first radius 392 transitions the support surface 314 to a first angled sidewall 322. The first angled sidewall 322 extends upward and outward from the first radius 392 and away from the center 332 toward a second arcuate surface defined by a second radius 394. The first angled sidewall 322 defines an outer wall 372 of the pocket 370. A gap is formed between the substrate 105 and the outer wall 372. The second radius 394 transitions the first angled sidewall 322 to a first upper surface 324. The first upper surface 324 extends from the second radius 394 to a third radius 396. The third radius 396 transitions the first upper surface 324 to a second angled sidewall 326. The second angled sidewall 326 extends downward and outward from the third radius 396 to a fourth radius 398. The fourth radius 398 transitions the second angled sidewall 326 downward and outward from the second angled sidewall 326 to a second upper surface 328. The second upper surface 328 extends from the fourth radius 398 to the outer periphery 334 of the body 302 of the substrate support 300. The second upper surface 328 is disposed below the first upper surface 324.

The first radius 392 is between 0.010 inches and about 0.020 inches. The second radius 394 provides a large radius (rounding) to reduce plasma coupling. The second radius 394 is between 0.020 inches and about 0.030 inches. The third radius 396 is smaller than the second radius 394 to increase plasma density and avoid edge effects on the substrate. The third radius 396 is between 0.0001 inches and about 0.010 inches. The fourth radius 398 may be substantially similar or in the same range of the first radius 392. The fourth radius 398 is between 0.010 inches and about 0.020 inches.

In one example, the second radius 394 is larger than the first radius 392, the third radius 396 is smaller than first radius 392, and the fourth radius 398 is the same as the first radius.

A first distance 382 is provided for the first radius 392 relative to the center 332. The first distance 382 defines a gap 362 between the substrate 124 and the first angled sidewall 322, such as a bottom end of the first angled sidewall 322. In one example, the first distance 382 of the first radius 392 from the center 332 is between about 5.5 inches and about 6.15 inches. In one example, the first distance 382 is between about 5.5 inches to about 6.0 inches from the center 332. In one example, the first distance 382 is between about 5.91 inches to about 6.15 inches from the center 332.

The first upper surface 324 is higher than the support surface 314. The first upper surface 324 is a second distance 384 above the support surface 314 to promote process uniformity by extending the plasma sheath beyond the edge of the substrate 105. The second distance 384 defines a height of the pocket 370. In one example, the second distance 384 of the first upper surface 324 above the support surface 314 is between about 0.015 inches and about 0.500 inches. In one example, the second distance 384 is between about 0.015 inches and about 0.100 inches.

The second upper surface 328 is lower that the first upper surface 324 and higher than the support surface 314. The second upper surface 328 is a third distance 386 above the support surface 314 to prevent arcing. In one example, the third distance 386 of the second upper surface 328 above the support surface 314 is between about 0.005 inches to about 0.500 inches.

Advantageously, the pocket 370 is close to the substrate 124 to minimize the exposed area at the level of the substrate 124 to reduce the potential for arcing. The smooth rounding of the substrate side of the pocket 370 facilitates preventing increased local plasma density. The smooth rounding of the substrate side of the pocket 370 also facilitates preventing deposition thickness reduction, such as at locations near the substrate edge. The pocket height is chosen such that a highly tensile bow substrate can be prevented from sliding away, while reducing or minimizing shadowing effects. The pocket height is equal to the second distance 384. In one example, the pocket height is between about 0.015 inches and about 0.500 inches. The lower radius disposed outside of the pocket (such as the third radius 396 and/or the fourth radius 398) increases plasma density on the outside area, which reduces edge effects on substrate. Furthermore, a stepped surface (such as the second upper surface 328) behind the pocket 370 minimizes exposed area at substrate level, and thus prevents arcing. Aspects of the substrate support 300 improve edge thickness uniformity to about ~2% vs 5% for typical Tight Pocket Heater (TPH) films.

The first distance 382 is taken along a horizontal plane. The second distance 384 and the third distance 386 are taken along a vertical plane that is substantially perpendicular to the horizontal plane of the first distance 382.

The first radius 392, second radius 394, third radius 396, fourth radius 398, first angled sidewall 322, first upper surface 324, second angled sidewall 326, and second upper surface 328 at least partially form a protrusion of the body 302 that protrudes upward from the support surface 314. The protrusion is integrally formed with the body 302.

Figure 4A:
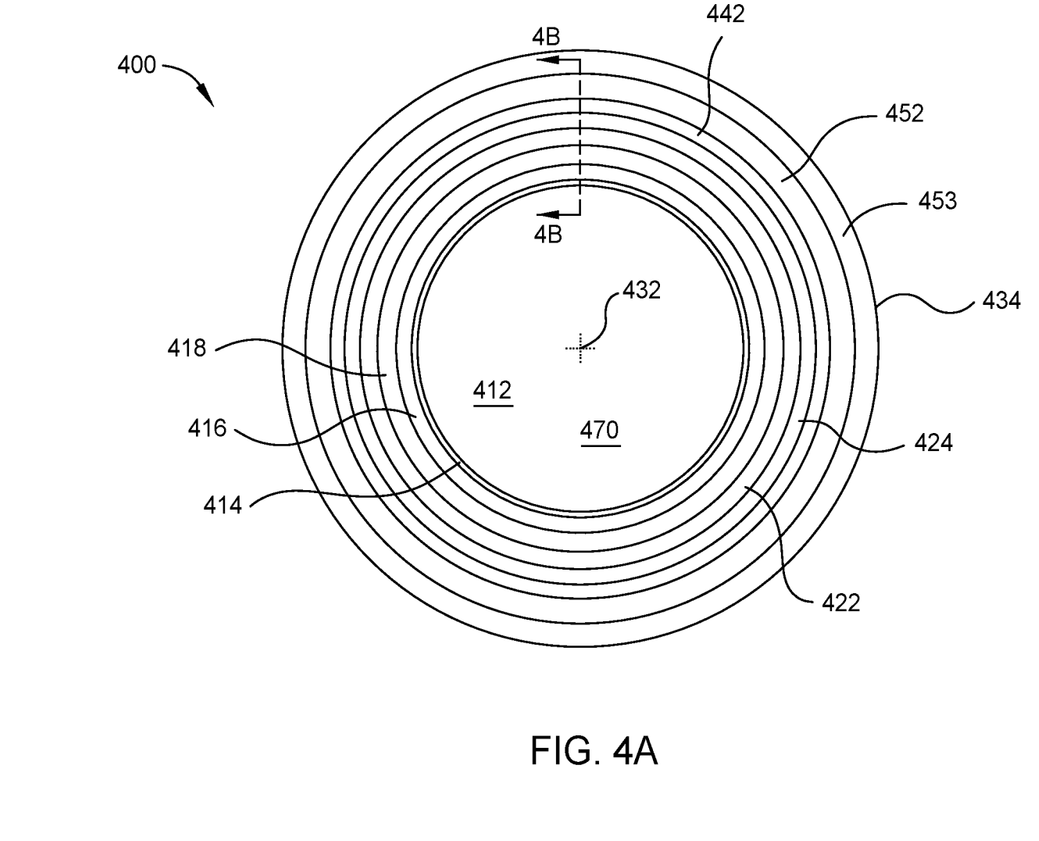
FIG. 4A is a top schematic view of a substrate support, according to one implementation.
Figure 4B:
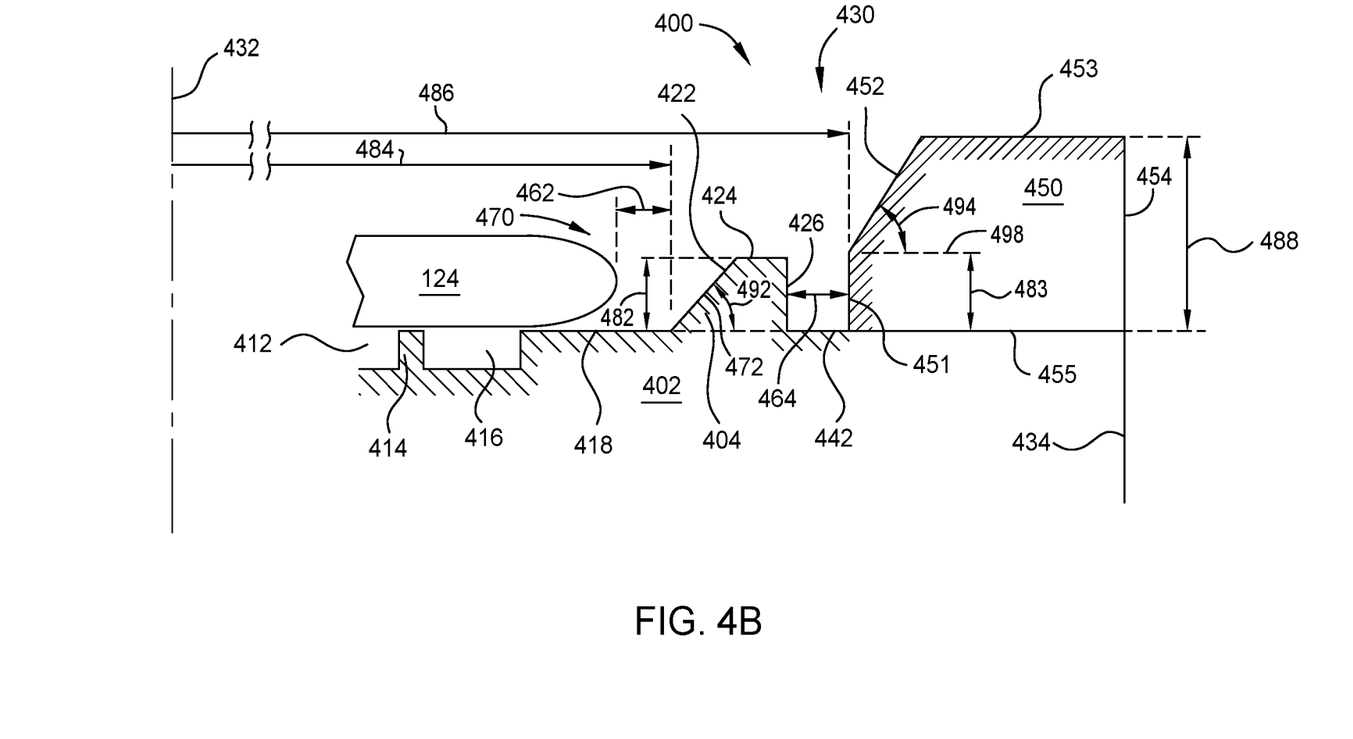
FIG. 4B is a cross sectional schematic view of the substrate support illustrated in FIG. 4A, according to one implementation.

FIG. 4A is a top schematic view of a substrate support 400, according to one implementation. The substrate support 400 is suitable for use as the substrate support 174 in the plasma processing chamber 100 of FIG. 1. FIG. 4B is a cross sectional schematic view of the substrate support 400 illustrated in FIG. 4A, according to one implementation. FIGS. 4A and 4B will be discussed together. The substrate support 400 has an edge ring 450 that is separable from the substrate support 400.

The substrate support 400 has a body 402. The body 402 has a circular top profile with a center 432 and an outer periphery 434. The body 402 has a plurality of surfaces extending along a top face 430 of the body 402. In one example, the edge ring 450 is separable from the body 402. The body 402 has a lower ledge 412 which extends from the center 432 of the substrate support 400. The lower ledge 412 extends to a first lip 414. The first lip 414 is configured to support the substrate 105 thereon. A troth 416 extends from the first lip 414 to a second lip 418. The first lip 414 and the second lip 418 are substantially coplanar and/or parallel with the troth 416 below both the first lip 414 and the second lip 418. The first lip 414 and the second lip 418 are configured to support the substrate 105 thereon in a pocket 470. One or more support surfaces of the first lip 414 and/or the second lip 418 are configured to support the substrate 124.

The second lip 418 extends from the troth 416 to a first angled wall 422. The first angled wall 422 defines an outer-wall 472 of the pocket 470. The first angled wall 422, such as a bottom end of the first angled wall 422, begins at a first distance 484 from the center 432. The first angled wall 422 angles upward and outward at a first angle 492 from a plane of the second lip 418. The first distance 484 is between about 5.5 inches to about 6.15 inches from the center 432. In one example, the first distance 484 is between about 5.5 inches to about 6.0 inches from the center 432. In one example, the first distance 484 is between about 5.91 inches to about 6.15 inches from the center 432. The first distance 484 defines a gap 462 between the substrate 124 and a protrusion 404 of the body 402.

The protrusion 404 is at least partially defined by the first angled wall 422 and is integrally formed with the body 402. The first angle 492 is between about 30 degrees and 90 degrees, as shown in FIG. 4B. The first angled wall 422 extends to a first top surface 424 of the protrusion 404. The first top surface 424 is a first distance 482 between about 0.010 inches and about 0.030 inches above the second lip 418. The first distance 482 defines a height of the pocket 470. The first top surface 424 extends to a rear wall 426 of the protrusion 404. The rear wall 426 extends downward to an outer surface 442 that is no longer on the protrusion 404. The rear wall 426 defines an outer boundary of the protrusion 404.

The outer surface 442 extends to the outer periphery 434 of the body 402. The outer surface 442 may be substantially coplanar and/or parallel with the second lip 418. The edge ring 450 is disposed on the outer surface 442 outside of the protrusion 404. The edge ring 450 has a front surface 451. The front surface 451 is disposed at a second distance 486 from the center 432 of the body 402, which corresponds to a center of the edge ring 450. The second distance 486 is between about 6.00 inches and about 6.5 inches from the center 432 of the body 402. The second distance 486 defines a second gap 464 disposed between the edge ring 450 and the rear wall 426 of the protrusion 404 of the body 402.

A ratio is defined by the second distance 486 of the front surface 451 relative to the first distance 484 of the first angled wall 422. In one example, the ratio of the second distance 486 to the first distance 484 is within a range of 1.00 to 1.2, such as 1.05 to 1.2 or 1.08 to 1.095.

The front surface 451 of the edge ring 450 extends upward a second distance 483 from the outer surface 442. The second distance 483 is between about 0.10 inches and about 0.30 inches. The second distance 483 of the front surface 451 may be substantially similar to, such as the same as, the first distance 482 of the protrusion 404. A first angled wall 452 extends from the front surface 451 and angles upward and outward at a second angle 494 from a plane 498 that is orthogonal to the front surface 451. The second angle 494 of the first angled wall 452 is between about 5 degrees and 20 degrees as shown. The first angled wall 452 extends to a top surface 453. The top surface 453 extends to an outer wall 454. The top surface 453 is above the first top surface 424. The top surface 453 is disposed at a third distance 488 above the outer surface 442. The outer wall 454 may be aligned with the outer periphery 434 of the body 402 of the substrate support 400. The outer wall 454 may extend beyond or short of the outer periphery 434. The outer wall 454 extends down from the top surface 453 to a bottom surface 455 of the edge ring 450. The bottom surface 455 extends inward from the outer wall 454 to the front surface 451. The bottom surface 455 of the edge ring 450 is disposed on, and interfaces with, the outer surface 442 of the body 402 of substrate support 400.

The first distance 484 and second distance 486 are taken along a horizontal plane. The first distance 482, second distance 483, and third distance 488 are taken along a vertical plane that is substantially perpendicular to the horizontal plane of the first distance 484 and the second distance 486.

The first angled wall 222, first upper surface 224, second angled wall 226, and second upper surface 228 at least partially form a protrusion of the body 202 that protrudes upward from the second lip 218. The protrusion is integrally formed with the body 202.

Benefits for aspects of the substrate supports disclosed herein provide significant arcing margin, better deposition uniformity, less edge thickness loss, less substrate sliding, ease of machinability, reduced cost such as reduced manufacturing cost, enabled high RF power substrate processing, reduced substrate defects, and improved substrate throughput and yield.

The present disclosure contemplates that one or more of the aspects, features, components, and/or properties of the substrate support 200, the substrate support 300, and/or the substrate support 400 may be combined or utilized independently. The present disclosure also contemplates that the combined or independent aspects, features, components, and/or properties may achieve one or more of the above benefits.

While the foregoing is directed to implementations of the present invention, other and further implementations of the invention may be devised without departing from the basic scope thereof, and the scope thereof is determined by the claims that follow.

What is claimed is:

1. A substrate support, comprising:
a body having a center;
a support surface configured to at least partially support a substrate;
a first angled wall that extends upward and radially outward at a first angle relative to the support surface, the first angle less than 90 degrees;
a first upper surface disposed above the support surface;
a second angled wall that begins at a location above the support surface, and extends upward and radially outward relative to the first upper surface, wherein the first upper surface is disposed between the first angled wall and the second angled wall; and
a second upper surface disposed outwardly of the second angled wall, the second upper surface being disposed above the first upper surface.

2. The substrate support of claim 1, wherein the support surface, the first angled wall, the first upper surface, the second angled wall, and the second upper surface are integrally formed with the body.

3. The substrate support of claim 1, wherein the first upper surface and the second upper surface are parallel to the support surface.

4. The substrate support of claim 1, wherein the first angled wall begins at a first distance from the center of the body, the second angled wall begins at a second distance from the center of the body, and a difference between the second distance and the first distance defines a step width of the first angled wall and the first upper surface.

5. The substrate support of claim 4, wherein:
the first distance is within a range of 5.5 inches to 6.15 inches;
the second distance is within a range of 6.0 inches to 7.0 inches; and
the step width is 1.5 inches or less.

6. The substrate support of claim 4, wherein a ratio of the step width relative to the first distance is 0.3 or less.

7. The substrate support of claim 1, wherein the second angled wall extends upward and radially outward at a second angle relative to the support surface, wherein the second angle is smaller than the first angle.

8. The substrate support of claim 7, wherein the first angle is 30 degrees or larger, and the second angle is within a range of 5 degrees to 60 degrees.

9. The substrate support of claim 1, further comprising:
a lower ledge extending from the center to a first lip;
a second lip disposed radially outward of the first lip, and separated from the first lip by a channel, wherein the support surface is on the second lip; and
a second support surface on the first lip.

10. The substrate support of claim 1, wherein:
the first angled wall extends upward and radially outward from the support surface;
the second angled wall extends upward and radially outward from the first upper surface;
the first upper surface extends between the first angled wall and the second angled wall; and
the second upper surface extends from the second angled wall.

11. A substrate support, comprising:
a body having a center;
a pocket in the body including a support surface raised above a lower ledge and configured to at least partially support a substrate, wherein a sidewall of the pocket includes a first angled wall that extends upward and radially outward at a first angle relative to the support surface, the first angle less than 90 degrees;
a first upper surface disposed above the support surface;
a second angled wall that begins at a location above the support surface, and extends upward and radially outward relative to the first upper surface, wherein the first upper surface is disposed between the first angled wall and the second angled wall; and
a second upper surface disposed outwardly of the second angled wall, the second upper surface being disposed above the first upper surface.

12. The substrate support of claim 11, wherein a first radius transitions the support surface to the first angled wall.

13. The substrate support of claim 12, wherein:
a second radius transitions the first angled wall to the first upper surface;
a third radius transitions the first upper surface to the second angled wall;
a fourth radius transitions the second angled wall to the second upper surface; and
the second upper surface extends from the fourth radius to an outer periphery of the body.

14. The substrate support of claim 11, wherein:
the first angled wall is disposed at a first distance from the center of the body;
the second angled wall is disposed at a second distance from the center of the body; and
a ratio of the second distance relative to the first distance is within a range of 1.0 to 1.3.

15. A substrate support, comprising:
a body having a center;
a support surface configured to at least partially support a substrate;
a first angled wall that extends upward and radially outward at a first angle relative to the support surface, the first angle less than 90 degrees;
a first radius that transitions the first angled wall to a first upper surface disposed above the support surface;
a second angled wall that extends upward and radially outward relative to the first upper surface, the first upper surface being disposed between the first radius and the second angled wall; and
a second upper surface disposed outwardly of the second angled wall, the second upper surface being disposed above the first upper surface.

16. The substrate support of claim 15, wherein the support surface, the first angled wall, the first radius, the first upper surface, the second angled wall, and the second upper surface are integrally formed with the body.

17. The substrate support of claim 15, further comprising at least one of:
a second radius that transitions the support surface to the first angled wall;
a third radius that transitions the second angled wall to the second upper surface; or
a fourth radius that transitions the first upper surface to the second angled wall.

18. The substrate support of claim 15, wherein the first radius is within a range of 0.010 inches to 0.020 inches.

19. The substrate support of claim 15, wherein the first upper surface is a distance above the support surface, and the distance is within a range of 0.005 inches to 0.050 inches.

20. The substrate support of claim 15, wherein the second upper surface is a distance above the support surface, and the distance is within a range of 0.050 inches to 0.500 inches.

* * * * *